(12) United States Patent
Iesaka et al.

(10) Patent No.: US 11,735,997 B2
(45) Date of Patent: Aug. 22, 2023

(54) UPPER ARM DRIVE CIRCUIT HAVING A REVERSE CURRENT PREVENTION CIRCUIT DISPOSED BETWEEN A POWER SUPPLY OF A POWER CONVERSION DEVICE AND A FIRST CAPACITOR AND CONTROL METHOD THEREOF

(71) Applicant: Hitachi Power Semiconductor Device, Ltd., Hitachi (JP)

(72) Inventors: Satoshi Iesaka, Hitachi (JP); Kenji Sakurai, Hitachi (JP); Tomoya Taniguchi, Hitachi (JP)

(73) Assignee: HITACHI POWER SEMICONDUCTOR DEVICE, LTD., Hitachi (JP)

( * ) Notice: Subject to any disclaimer, the term of this patent is extended or adjusted under 35 U.S.C. 154(b) by 23 days.

(21) Appl. No.: 17/331,685

(22) Filed: May 27, 2021

(65) Prior Publication Data

US 2022/0037984 A1 Feb. 3, 2022

(30) Foreign Application Priority Data

Jul. 28, 2020 (JP) ................................. 2020-127242

(51) Int. Cl.
*H02M 1/08* (2006.01)
*H02M 1/32* (2007.01)

(52) U.S. Cl.
CPC ............... *H02M 1/08* (2013.01); *H02M 1/32* (2013.01)

(58) Field of Classification Search
CPC ........ H02M 1/08; H02M 1/32; H02M 1/0038; H02M 1/0006; H02M 7/003;
(Continued)

(56) References Cited

U.S. PATENT DOCUMENTS 6,326,831 B1 12/2001 Kumagai
7,453,308 B2 * 11/2008 Tihanyi .............. H03K 17/0822
327/309
(Continued)

FOREIGN PATENT DOCUMENTS

CN 101753000 A 6/2010
CN 102130643 A 7/2011
(Continued)

OTHER PUBLICATIONS

Indian Office Action received in corresponding Indian Application No. 202114031462 dated Mar. 26, 2022.
(Continued)

*Primary Examiner* — Kyle J Moody
*Assistant Examiner* — Jye-June Lee
(74) *Attorney, Agent, or Firm* — Mattingly & Malur, PC

(57) ABSTRACT

The upper arm drive circuit for controlling drive of the upper arm switching element of the power conversion device includes: a capacitor disposed between a gate of the upper switching element and the output terminal of the power conversion device; a reverse current prevention circuit that is disposed between a power supply of the power conversion device and the capacitor, and that makes a current flow from a first terminal side of the reverse current prevention circuit connected to the power supply side to a second terminal side of the reverse current prevention circuit connected to the capacitor side and prevents a reverse current from flowing from the second terminal side to the first terminal side; and a switching element for capacitor charging that is turned ON in synchronization with a command signal that turns the upper arm switching element ON.

11 Claims, 11 Drawing Sheets

(58) Field of Classification Search
CPC ............ H02M 7/53871; H02M 7/5387; H03K 2217/0063; H03K 2217/0081
See application file for complete search history.

(56) References Cited

U.S. PATENT DOCUMENTS

| | | | |
|---|---|---|---|
| 2007/0273427 A1* | 11/2007 | Ricotti | ............... H03K 17/6874 327/427 |
| 2014/0191784 A1 | 7/2014 | Hatanaka et al. | |
| 2021/0242867 A1* | 8/2021 | Nosaka | ................ H03K 17/162 |

FOREIGN PATENT DOCUMENTS

| | | | | |
|---|---|---|---|---|
| CN | 103683872 A | | 3/2014 | |
| CN | 110061621 A | * | 7/2019 | .............. H02M 1/08 |
| DE | 10 2015 220 594 A1 | | 4/2016 | |
| GB | 2533677 A | | 6/2016 | |
| JP | 2005-051821 A | | 2/2005 | |
| JP | 5629386 B2 | | 11/2014 | |
| JP | 2019-75887 A | | 5/2019 | |
| JP | 2020-68630 A | | 4/2020 | |

OTHER PUBLICATIONS

German Office Action received in corresponding German Application No. 10 2021 207 090.6 dated Sep. 30, 2022.
Korean Office Action received in corresponding Korean Application No. 10-2021-0088263 dated Feb. 2, 2023.

* cited by examiner

UPPER ARM DRIVE CIRCUIT HAVING A REVERSE CURRENT PREVENTION CIRCUIT DISPOSED BETWEEN A POWER SUPPLY OF A POWER CONVERSION DEVICE AND A FIRST CAPACITOR AND CONTROL METHOD THEREOF

CLAIM OF PRIORITY

The present application claims priority from Japanese Patent application serial no. 2020-127242, filed on Jul. 28, 2020, the content of which is hereby incorporated by reference into this application.

BACKGROUND OF THE INVENTION

The present invention relates to the configurations of drive circuits for controlling the drives of power conversion devices (inverters), and, in particular, relates to a technology effective when applied to the upper arm drive circuit of a power conversion device.

Along with the worldwide increasing awareness about environmental conservation, energy saving is more severely required, so that power conversion devices (inverters) are widely adopted in various fields. And power conversion devices installed in the drive systems of railroad vehicles, air conditioners, and the like are faced with an important challenge in that how the power conversion devices can be made highly sophisticated and effective as well as how the power conversion devices are made small in size and weight and highly reliable.

In order to realize the reduction in size and weight of a power conversion device (an inverter), it becomes very important to adopt power devices with low losses, and therefore low-loss power devices using SiC (silicon carbide) as base materials have been widely adopted instead of power devices using Si (silicon) as base materials. Furthermore, the development of cooling systems having improved cooling efficiencies for cooling power devices and the challenges of reduction of the sizes and weights of inverters have been carried forward as well.

As one of the background technologies in this technical field, there is a technology disclosed in Japanese Unexamined Patent Application Publication No. 2005-51821, for example. Japanese Unexamined Patent Application Publication No. 2005-51821 says, "A level shift circuit comprising: one or a plurality of controllable semiconductor elements, the potential reference electrode of each controllable semiconductor element being connected to a common potential, a conductive state being held between the potential reference electrode and the main electrode of each controllable semiconductor element during a period in which a conduction signal is inputted between the potential reference electrode and the control electrode of each controllable semiconductor element; a DC power supply, one pole of the DC power supply being connected to a predetermined part of an external circuit the potential of which fluctuates between a common potential and a predetermined high potential, the DC power supply having a voltage lower than a voltage between the above two potentials; one or a plurality of load resistors, one ends of each load resistor being connected to the other pole of the DC power supply, the other ends of the load resistors being connected to the main electrodes of the controllable semiconductor elements one-on-one; and a logic circuit operating under the DC power supply, wherein a pulse-shaped conduction signal is inputted into the control electrode of each controllable semiconductor element, the level shift circuit transmits a pulse-shaped voltage drop generated across a load resistor corresponding to each controllable semiconductor element owing to the conduction of each controllable semiconductor element as a signal to the logic circuit, and a resistor for current negative feedback is inserted between the potential reference electrode of each controllable semiconductor element and the common potential, so that a voltage between the control electrode and the common potential at the time of the conduction of each controllable semiconductor element is set to a predetermined value smaller than the voltage of the DC power supply."

SUMMARY OF THE INVENTION

As mentioned above, power conversion devices installed in the drive systems of railroad vehicles, air conditioners, and the like are faced with an important challenge in that how the power conversion devices can be made small in size and weight and highly reliable.

According to Japanese Unexamined Patent Application Publication No. 2005-51821, it becomes possible that a small and little variable drain (or collector) current is flowed independently of a voltage between the drain and source (or between the collector and emitter) of a high withstand voltage transistor, so that a stable signal can be transmitted because a voltage drop across a load resistor can be kept appropriate independently of the potential value of a circuit portion that fluctuates from time to time. However, since an RS latch is used, it becomes necessary to install a pulse signal generation circuit for generating pulse signals (an ON-signal and an OFF-signal) for the RS latch and a reset signal generation circuit (a reset terminal) for generating a reset signal for the RS latch, and therefore the size of the level shift circuit cannot be reduced, which is disadvantageous to making a power conversion device (an inverter) small in size and weight. In addition, if the RS latch reacts to an erroneous inputted signal such as a noise, the RS latch is kept in a state other than an intended state, which may lead to the false operations of the power conversion device.

Therefore, an object of the present invention is to provide an upper arm drive circuit that is capable of holding the gate voltage of an upper arm switching element without using a latch circuit in a power conversion device having a bridge circuit composed of an upper arm and a lower arm and that is also capable of making the power conversion device small in size and weight and highly reliable as well and a control method of the upper arm drive circuit.

In order to solve the abovementioned problem, the present invention proposes an upper arm drive circuit for controlling drive of an upper arm switching element of a power conversion device, the upper arm drive circuit including: a capacitor disposed between a gate of the upper switching element and an output terminal of the power conversion device; a reverse current prevention circuit disposed between a power supply of the power conversion device and the capacitor, the reverse current prevention circuit making a current flow from a first terminal side of the reverse current prevention circuit connected to the power supply side to a second terminal side of the reverse current prevention circuit connected to the capacitor side and preventing a reverse current from flowing from the second terminal side to the first terminal side; and a switching element for capacitor charging that is connected to the first terminal side or to the second terminal side of the reverse current prevention circuit so as to be serially connected to the reverse current prevention circuit between the power supply and the capacitor and that is turned ON in synchronization with a command signal that turns the upper arm switching element ON.

Furthermore, the present invention proposes a control method of an upper arm drive circuit for controlling drive of an upper arm switching element of a power conversion device, the control method including the steps of: (a) turning on a power supply of the power conversion device; (b) charging a capacitor disposed between a gate of the upper arm switching element of the power conversion device and an output terminal of the power conversion device in synchronization with a command signal that turns the upper arm switching element ON; (c) holding an ON-state of the upper arm switching element of the power conversion device during a period in which the upper arm switching element of the power conversion device is in the ON-state while preventing discharge from the capacitor to a power supply side of the power conversion device by a reverse current prevention circuit disposed between the capacitor and the power supply of the power conversion device; and (d) discharging charge of the capacitor in synchronization with a command signal for turning the upper arm switching element OFF.

According to the present invention, an upper arm drive circuit that is capable of holding the gate voltage of an upper arm switching element without using a latch circuit in a power conversion device having a bridge circuit composed of an upper arm and a lower arm and that is also capable of making the power conversion device small in size and weight and highly reliable as well and a control method of the upper arm drive circuit can be realized.

Problems, configurations, and advantageous effects other than the above will be explicitly shown by the descriptions of the following embodiments.

DETAILED DESCRIPTION OF THE PREFERRED EMBODIMENTS

Hereinafter, embodiments of the present invention will be explained with reference to the accompanying drawings. Here, in the following drawings, the same components are given the same reference signs, and detailed explanations about redundant parts will be omitted in some cases.

First Embodiment

Figure 15:
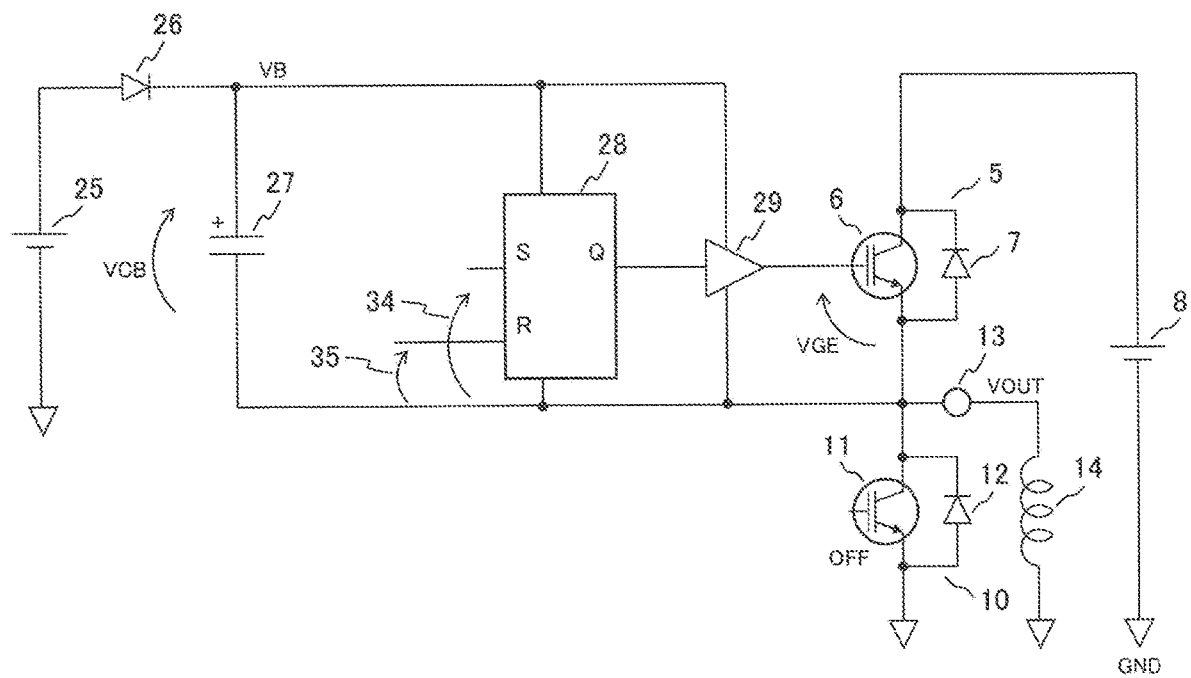
FIG. 15 is a diagram showing the outline configuration of an existing upper arm drive circuit.
Figure 16:
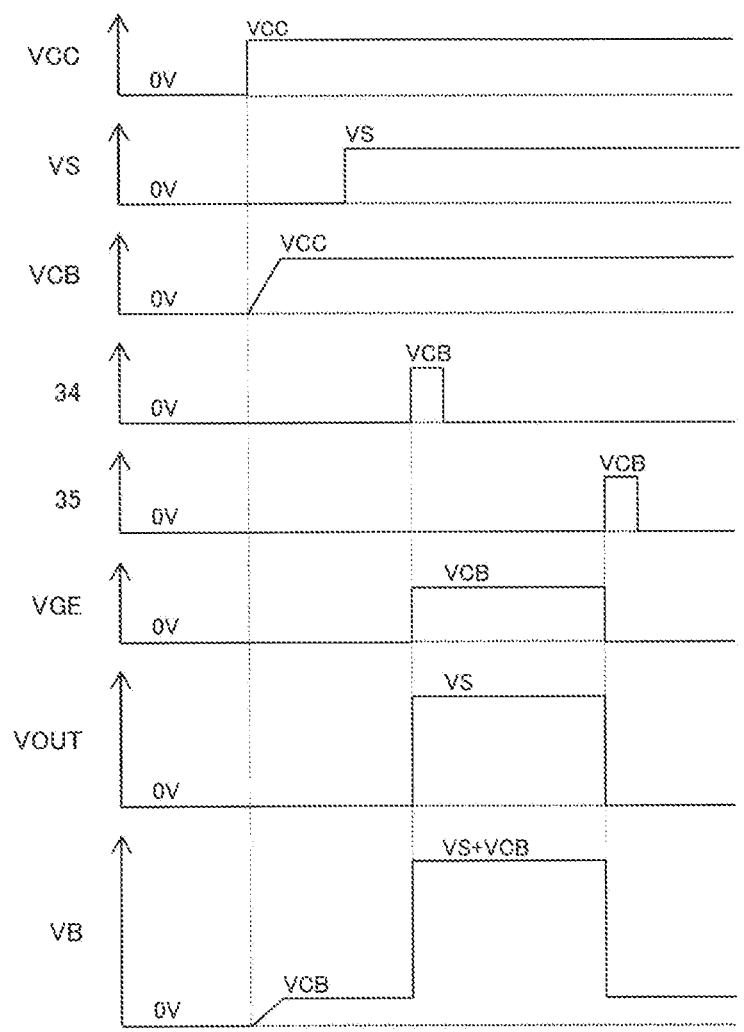
FIG. 16 is a timing chart showing the behavior of the existing upper arm drive circuit.

First, problems about the abovementioned existing power conversion device (inverter) will be explained in detail with reference to FIG. 15 and FIG. 16. FIG. 15 is a diagram showing the outline configuration of the upper arm drive circuit of the existing power conversion device, and FIG. 16 is a timing chart showing the behavior of the upper arm drive circuit.

Although, in the following explanations, a half-bridge circuit including one leg having an upper arm and a lower arm each of which is composed of a switching element and a free-wheeling diode connected to the switching element in antiparallel will be explained as an example of the power conversion device, a target to which the present invention can be applied is not limited to this half-bridge circuit, and the present invention can be applied to a power conversion device of an H-bridge circuit configured in such a way that a full-bridge configuration is formed by connecting one leg of a half-bridge circuit to another half-bridge circuit and connecting a load between the neutral point of the two legs, or can also be applied to a power conversion device of a three-phase full-bridge circuit configured in such a way that another leg is connected to an H-bridge circuit and the output terminals (the U-phase, V-phase, and W-phase terminals) of a three-phase alternating current are respectively connected to the neutral points of the respective legs.

In FIG. 15, a switching element 6 is the upper arm switching element of the power conversion device.

As shown in FIG. 15, the upper arm drive circuit of the existing power conversion device generally includes: a control circuit power supply 25; a diode 26; a capacitor 27; a latch circuit 28; and a buffer 29. The diode 26 is disposed between the control circuit power supply 25 and the capacitor 27. The capacitor 27, the power supply terminal of the latch circuit 28, and the power supply terminal of the buffer 29 are connected to one another in parallel. The output of the latch circuit 28 is connected to the input of the buffer 29. The output of the buffer 29 is connected to the gate of the switching element 6.

In addition, the capacitor 27, the power supply terminal of the latch circuit 28, and the power supply terminal of the buffer 29 are connected to the output terminal 13 of the power conversion device via the interconnection point (neutral point) of the upper arm 5 and the lower arm 10 of the power conversion device. The upper arm 5 is composed of the switching element 6 and a free-wheeling diode 7 connected to the switching element 6 in antiparallel, and the lower arm 10 is composed of a switching element 11 and a free-wheeling diode 12 connected to the switching element 11 in antiparallel.

A load (coil) 14 is connected to the output terminal 13. The main power supply 8 of the power conversion device is connected to the collector terminal of the switching element 6.

As shown in FIG. 16, in the upper arm drive circuit of the existing power conversion device, the control circuit power supply 25 is turned ON first, the capacitor 27 is charged via the diode 26, and a capacitor charging voltage VCB rises to a control circuit power supply voltage VCC.

Next, the main power supply 8 of the power conversion device is turned ON, an upper arm ON pulse signal 34 is inputted into the latch circuit 28, and the gate voltage VGE of the switching element 6 that is an upper arm switching element is risen to the capacitor charging voltage VCB, so that the switching element 6 is turned ON, and the ON-state of the switching element 6 is kept intact.

During the time of the switching element 6 being in an ON-state, the power supply voltage VS of the main power supply 8 is outputted as an output terminal voltage VOUT from the output terminal 13 of the power conversion device. During this period, the positive pole side voltage VB of the capacitor 27 (relative to the ground potential GND) is risen from the capacitor charging voltage VCB by the rising amount of the output terminal voltage VOUT (the power supply voltage VS), that is, the positive side voltage VB of the capacitor 27 becomes equal to the sum of the power supply voltage VS and the capacitor charging voltage VCB.

Afterward, an upper arm OFF pulse signal 35 is inputted into the latch circuit 28, the gate voltage VGE of the switching element 6 that is an upper arm switching element becomes 0 V, so that the switching element 6 is turned OFF, and the OFF-state of the switching element 6 is kept intact. At this time, the output terminal voltage VOUT gets back to 0 V, and the positive pole side voltage VB of the capacitor 27 (relative to the ground potential GND) also gets back to the capacitor charging voltage VCB.

As described above, in the upper arm drive circuit of the existing power conversion device, the latch circuit 28 is used for keeping the upper arm ON signal 34 and the upper arm OFF pulse signal 35, and therefore it is necessary to install a pulse signal generation circuit for generating these pulse signals for the latch circuit 28. Furthermore, if the latch circuit 28 reacts to an erroneous inputted signal such as a noise, the latch circuit 28 is kept in a state other than an intended state, which may lead to the false operations of the power conversion device.

Figure 1:
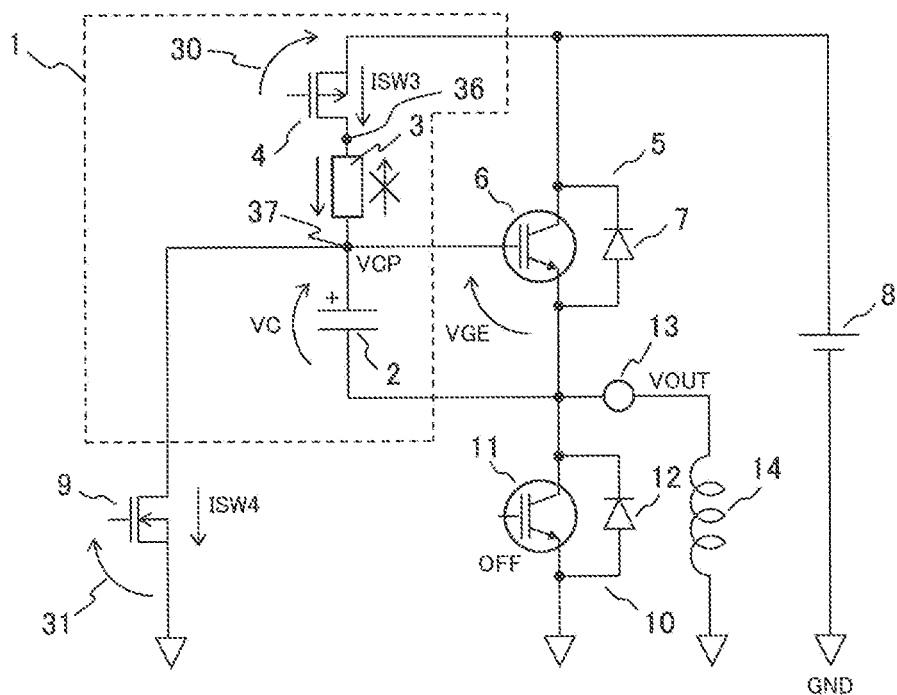
FIG. 1 is a diagram showing the outline configuration of an upper arm drive circuit according to a first embodiment of the present invention.
Figure 2:
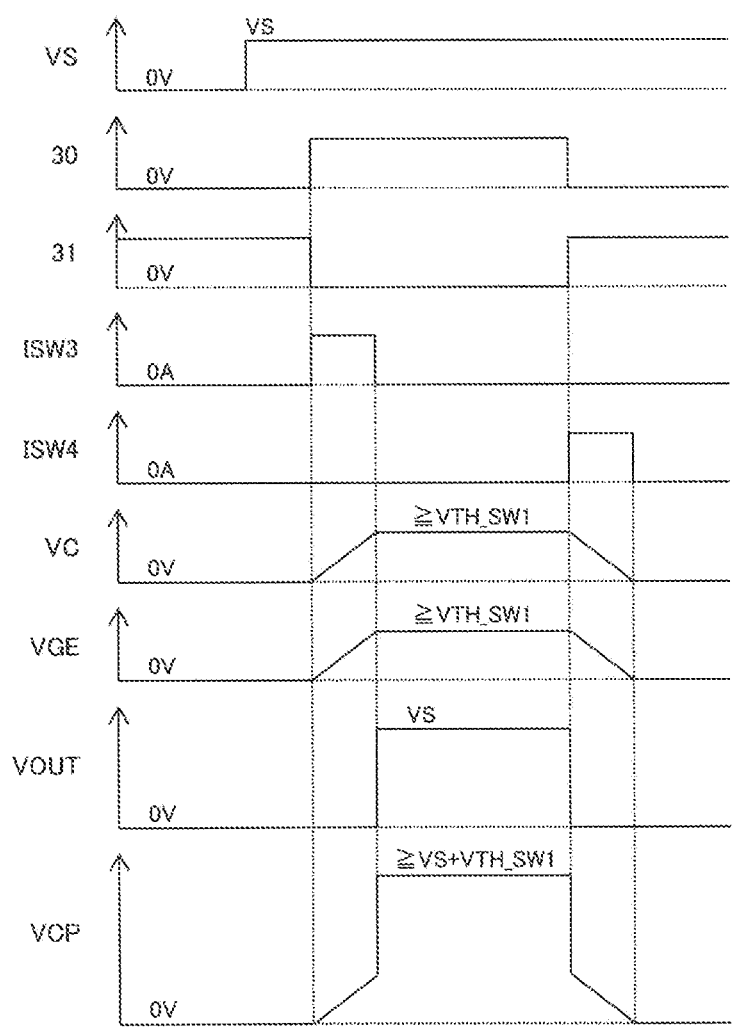
FIG. 2 is a timing chart showing the behavior of the upper arm drive circuit according to the first embodiment of the present invention.

The configuration of an upper arm drive circuit according to a first embodiment of the present invention and the behavior (control method) of the upper arm drive circuit will be explained with reference to FIG. 1 to FIG. 6. FIG. 1 is a diagram showing the outline configuration of the upper arm drive circuit of this embodiment, and FIG. 2 is a timing chart showing the behavior of the upper arm drive circuit. FIG. 3 to FIG. 6 show four concrete examples for realizing the upper arm drive circuit shown in FIG. 1.

As shown in FIG. 1, the upper arm drive circuit 1 of this embodiment includes: a capacitor 2; a reverse current prevention circuit 3; and a switching element 4 that is a switching element for charging the capacitor 2. The capacitor 2 is disposed between the gate of the switching element 6 of an upper arm 5 and an output terminal 13. Here, the capacitor 2 can be realized using a discrete element, or can be realized using a parasitic capacitor of the switching element 6. The reverse current prevention circuit 3 is disposed between the main power supply 8 of a power conversion device and the capacitor 2, and the reverse current prevention circuit 3 makes a current flow from the first terminal 36 side of the reverse current prevention circuit 3 connected to the main power supply 8 side to the second terminal 37 side of the reverse current prevention circuit 3 connected to the capacitor 2 side and prevents a reverse current from flowing from the second terminal 37 side connected to the capacitor 2 side to the first terminal 36 side connected to the main power supply 8 side.

The switching element 4 that is the switching element for charging the capacitor 2 is disposed between the main power supply 8 and the capacitor 2, and the switching element 4 is turned ON in synchronization with a command signal (an upper arm ON signal 30) for turning the switching element 6 that is an upper arm switching element ON.

In addition, one end of a switching element 9 that is a switching element for discharging the capacitor 2 is connected to a node between the capacitor 2 and the reverse current prevention circuit 3, and the switching element 9 is turned ON in synchronization with a command signal (an upper arm OFF signal 31) for turning the switching element 6 that is the upper arm switching element OFF, so that the capacitor 2 is discharged.

Here, the configurations of an upper arm 5 and a lower arm 10 that are included in the power conversion device in FIG. 1 are similar to those of the existing power conversion device shown in FIG. 15, so that detailed explanations will be omitted.

The behavior of the upper arm drive circuit 1 shown in FIG. 1 will be explained using FIG. 2. First, the main power supply 8 is turned ON. Next, the command signal (the upper arm ON signal 30) for turning the switching element 6 ON is inputted into the switching element 4, and the capacitor 2 is charged via the reverse current prevention circuit 3.

If the gate voltage VGE of the switching element 6 (that is, a charging voltage VC of the capacitor 2) exceeds the threshold voltage VTH_SW1 of the switching element 6, the switching element 6 that is the upper arm switching element is turned ON.

In this case, the charge of the capacitor 2 is prevented from being discharged from the capacitor 2 to the side of the main power supply 8 via the switching element 4 by the reverse current prevention circuit 3, so that the charging voltage VC of the capacitor 2 is kept intact. Therefore, the gate voltage VGE of the switching element 6 is kept as it is, so that the ON-state of the switching element 6 that is the upper arm switching element, is kept intact.

During the time of the switching element 6 being in an ON-state, the power supply voltage VS of the main power supply 8 is outputted from the output terminal 13 of the power conversion device as an output terminal voltage VOUT. During this period, the positive pole side voltage VCP of the capacitor 2 (relative to the ground potential GND) becomes equal to the sum of the power supply voltage VS and the threshold voltage VTH_SW1 of the switching element 6 or larger.

Afterward, the command signal (the upper arm OFF signal 31) for turning the switching element 6 OFF is inputted into the switching element 9 that is the switching element for discharging the capacitor 2, and the switching element 9 is turned ON, so that the capacitor 2 is discharged. Subsequently, the gate voltage VGE of the switching element 6 decreases to the threshold voltage VTH_SW1 or smaller, and the switching element 6 that is the upper arm switching element is turned OFF.

According to the upper arm drive circuit of this embodiment and the behavior (control method) of the upper arm drive circuit, it becomes possible to keep the gate voltage of the upper arm switching element intact without installing a latch circuit in the upper arm drive circuit.

Therefore, because it becomes unnecessary to install a latch circuit and a circuit for generating pulse signals to be sent to the latch circuit, the size of circuits inside the power conversion device can be made small, so that the downsizing and weight saving of the power conversion device can be realized, and on top of that, false operations of the power conversion device, which may occur when the latch circuit is kept in a state other than an intended state owing to the reaction of the latch to an erroneous signal such as a noise, can be prevented from occurring, which leads to the realization of a highly reliable power conversion device.

Here, FIG. 1 shows that the switching element 4 is connected nearer to the main power supply 8 side than the reverse current prevention circuit 3 is connected, but it is conceivable that the switching element 4 is disposed between the reverse current prevention circuit 3 and the capacitor 2. In other words, the connection order of the reverse current prevention circuit 3 and the switching element 4 that are serially disposed between the capacitor 2 and the main power supply 8 does not matter.

As described above, the upper arm drive circuit 1 of this embodiment shown in FIG. 1 includes: the capacitor 2 disposed between the gate of the upper arm switching element 6 and the output terminal 13 of the power conversion device; the reverse current prevention circuit 3 that is disposed between the main power supply 8 of the power conversion device and the capacitor 2 and that makes a current flow from the first terminal 36 side of the reverse current prevention circuit 3 connected to the main power supply 8 side to the second terminal 37 side of the reverse current prevention circuit 3 connected to the capacitor 2 side and prevents a reverse current from flowing from the second terminal 37 side to the first terminal 36 side; and the switching element 4 for capacitor charging that is connected to the first terminal 36 side or to the second terminal 37 side of the reverse current prevention circuit 3 so as to be serially connected to the reverse current prevention circuit 3 between the main power supply 8 and the capacitor 2 and that is turned ON in synchronization with the command signal (the upper arm ON signal 30) that turns the upper arm switching element 6 ON.

Four concrete examples for realizing the upper arm drive circuit shown in FIG. 1 will be explained with reference to FIG. 3 to FIG. 6.

Figure 3:
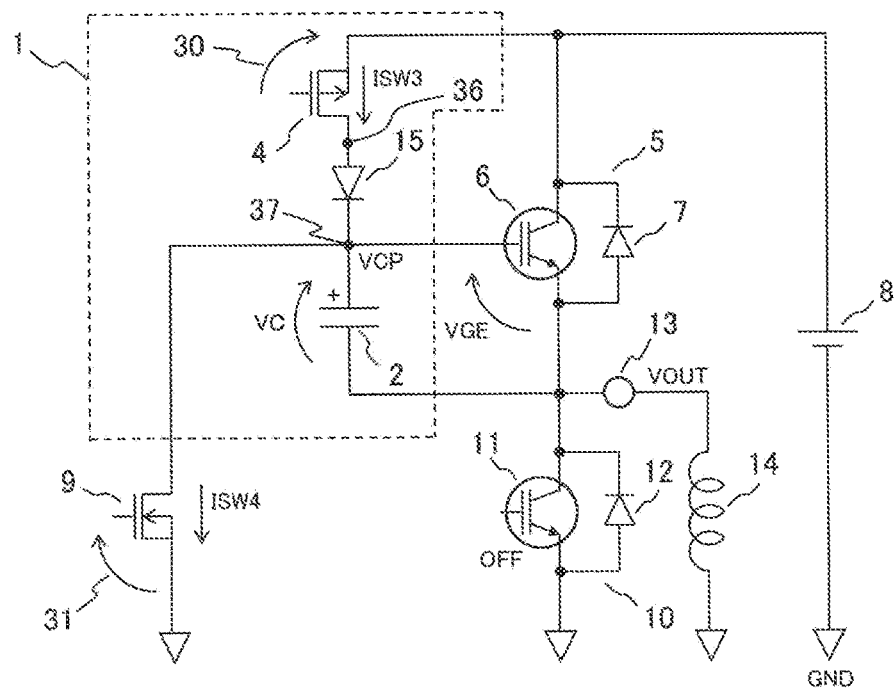
FIG. 3 is a diagram showing a concrete example of the upper arm drive circuit shown in FIG. 1 (a first concrete example)

FIG. 3 shows a concrete example in which a diode 15 is used as the reverse current prevention circuit 3. Using a diode as the reverse current prevention circuit 3 makes it possible to realize the upper arm drive circuit 1 in a simple configuration and at low cost as well. Here, although an example in which one diode is used as the reverse current prevention circuit 3 has been explained in FIG. 3, it is also conceivable that plural diodes 15 serially disposed between the main power supply 8 and the capacitor 2 are used. By using a combination of serially connected plural diodes as the reverse current prevention circuit 3, the reliability of the reverse current prevention circuit 3 is improved.

Figure 4:
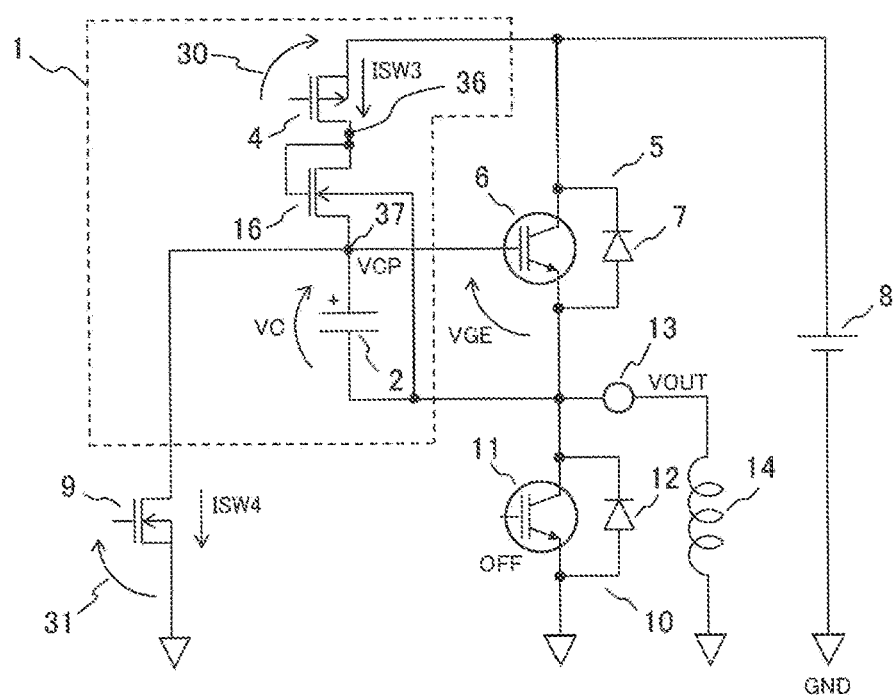
FIG. 4 is a diagram showing a concrete example of the upper arm drive circuit shown in FIG. 1 (a second concrete example)

FIG. 4 shows a concrete example in which a MOS transistor is used as the reverse current prevention circuit 3. A reverse current prevention function can be realized in such a way that, a MOS transistor is adopted as a switching element 16 that is a reverse current prevention switching element, the drain of the MOS transistor is connected to the first terminal 36 side, the source is connected to the second terminal 37 side, the gate and the drain are connected to each other, and the back-gate (that is, the substrate) of the MOS transistor is electrically connected to the output terminal 13 of the power conversion device.

Here, it is necessary that, when a MOS transistor is used as the switching element 16, the back-gate (substrate) of the MOS transistor should be connected to a point other than the source of the MOS transistor. If the back-gate is connected to the source, the reverse current prevention function does not work.

Figure 5:
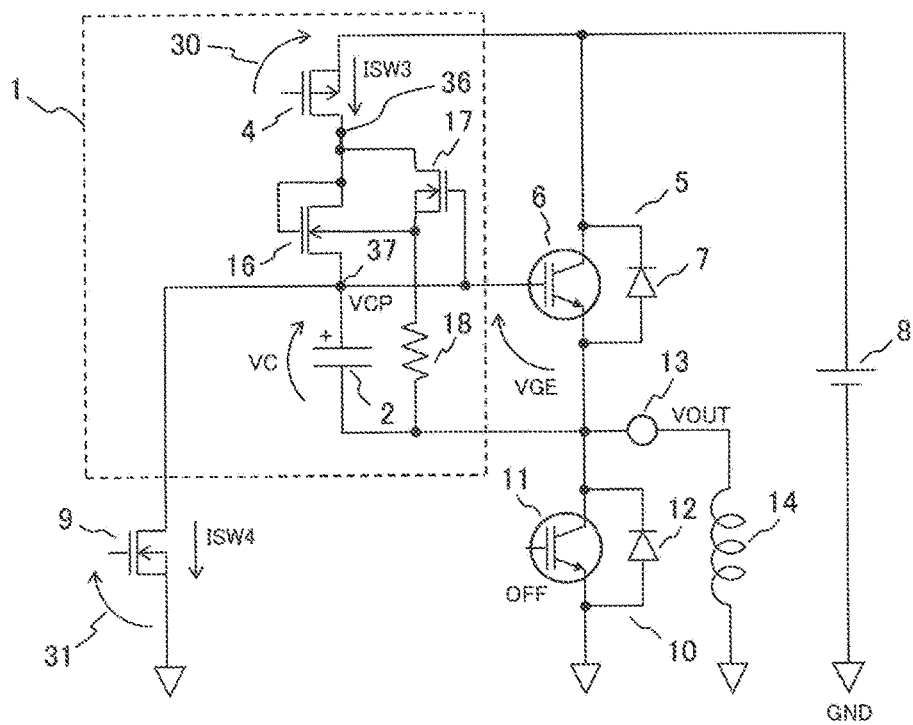
FIG. 5 is a diagram showing a concrete example of the upper arm drive circuit shown in FIG. 1 (a third concrete example)

FIG. 5 shows a modification of the upper arm drive circuit shown in FIG. 4, and FIG. 5 shows that this modification includes, as the reverse current prevention circuit 3, a switching element 16 (corresponding to the switching element 16 shown in FIG. 4) that is a first MOS transistor disposed between the main power supply 8 of the power conversion device and the capacitor 2, and a switching element 17 that is a second MOS transistor and a resistor 18 that are serially disposed between the main power supply 8 and the output terminal 13 of the power conversion device.

MOS transistors are respectively adopted as the switching element 16 disposed between the main power supply 8 of the power conversion device and the capacitor 2 and the switching element 17 disposed between the main power supply 8 and the output terminal 13 of the power conversion device. The drain of the first MOS transistor (16) is connected to the first terminal 36 side, and the source is connected to the second terminal 37 side. In addition, the drain of the second MOS transistor (17) is connected to the first terminal 36 side, and the source is connected to the output terminal 13 of the power conversion device via the resistor 18. Furthermore, by connecting the gate and drain of the first MOS transistor (16), and by electrically connecting the back-gate (substrate) of the first MOS transistor (16) to the output terminal 13 of the power conversion device via the resistor 18, a reverse current prevention function can be realized.

In addition, the voltage of the back-gate (substrate) of the first MOS transistor (16) is controlled by connecting the drain of the second MOS transistor (17) to the drain and gate of the first MOS transistor (16), by connecting the gate of the second MOS transistor (17) to the capacitor 2 and the gate of the switching element 6, and by connecting the source and back-gate (substrate) of the second MOS transistor (17) to the output terminal 13 of the power conversion device via the resistor 18, so that the current capacity of the first MOS transistor (16) can be improved.

Here, it is also necessary that the back-gate (substrate) of the first MOS transistor that is the switching element 16 should be connected to a point other than the source of the first MOS transistor. If the back-gate is connected to the source, the reverse current prevention function does not work.

Figure 6:
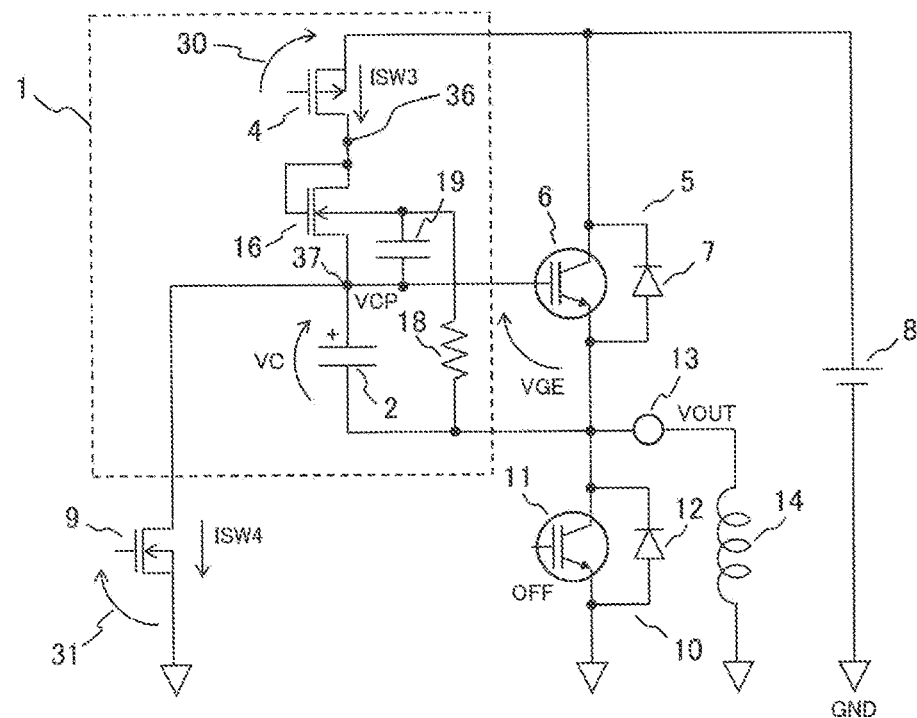
FIG. 6 is a diagram showing a concrete example of the upper arm drive circuit shown in FIG. 1 (a fourth concrete example)

FIG. 6 shows another modification of the upper arm drive circuit shown in FIG. 4, and FIG. 6 shows that this modification includes, as the reverse current prevention circuit 3, a MOS transistor (corresponding to the switching element 16 shown in FIG. 4), a resistor, and a capacitor.

A MOS transistor is adopted as the switching element 16 disposed between the main power supply 8 of the power conversion device and the capacitor 2, the gate and drain of the MOS transistor are connected to each other, the back-gate (substrate) of the MOS transistor is electrically connected to the output terminal 13 of the power conversion device via the resistor 18, and further another capacitor 19 that is different from the capacitor 2 is electrically disposed between the back-gate (substrate) of the MOS transistor and the capacitor 2, so that a reverse current prevention function can be realized. Furthermore, the current capacity of the MOS transistor can be improved by controlling the back-gate (substrate) of the MOS transistor using a highpass filter composed of the capacitor 19 and the resistor 18.

Here, it is also necessary in this case that the back-gate (substrate) of the MOS transistor should be connected to a point other than the source of the MOS transistor. If the back-gate is connected to the source, the reverse current prevention function does not work.

Second Embodiment

Figure 7:
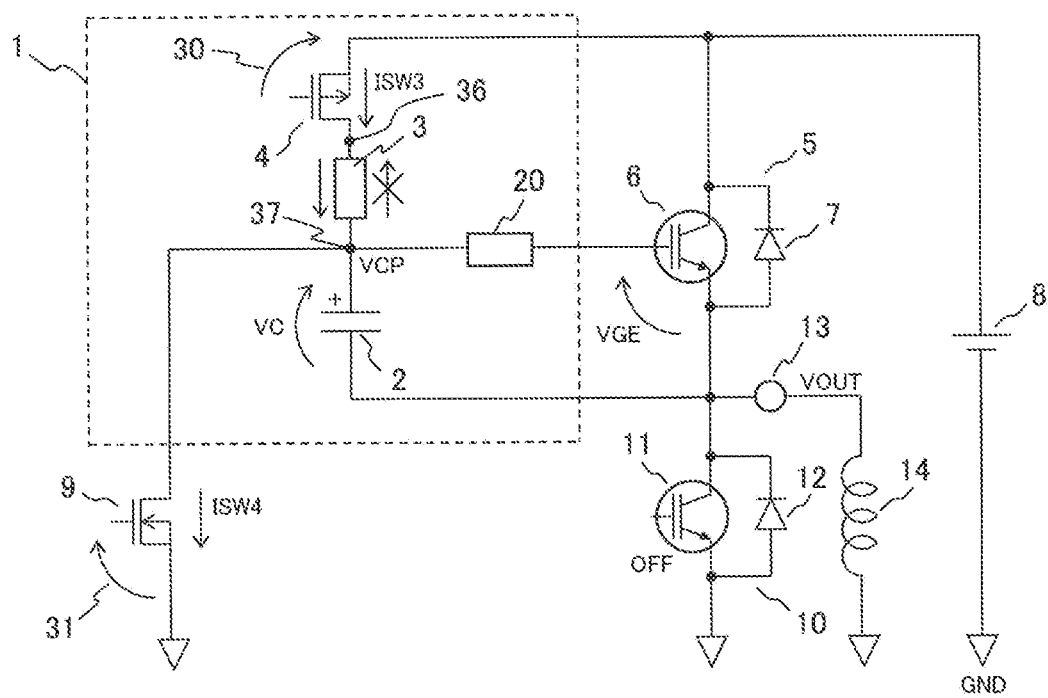
FIG. 7 is a diagram showing the outline configuration of an upper arm drive circuit according to a second embodiment of the present invention.
Figure 8:
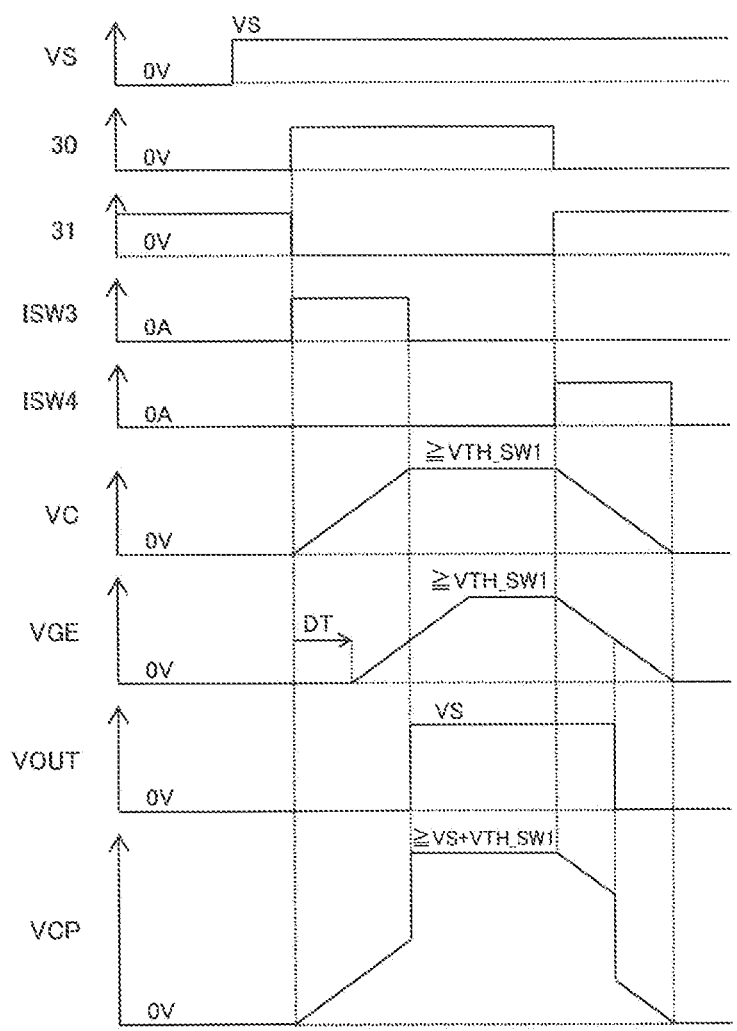
FIG. 8 is a timing chart showing the behavior of the upper arm drive circuit according to the second embodiment of the present invention.
Figure 9:
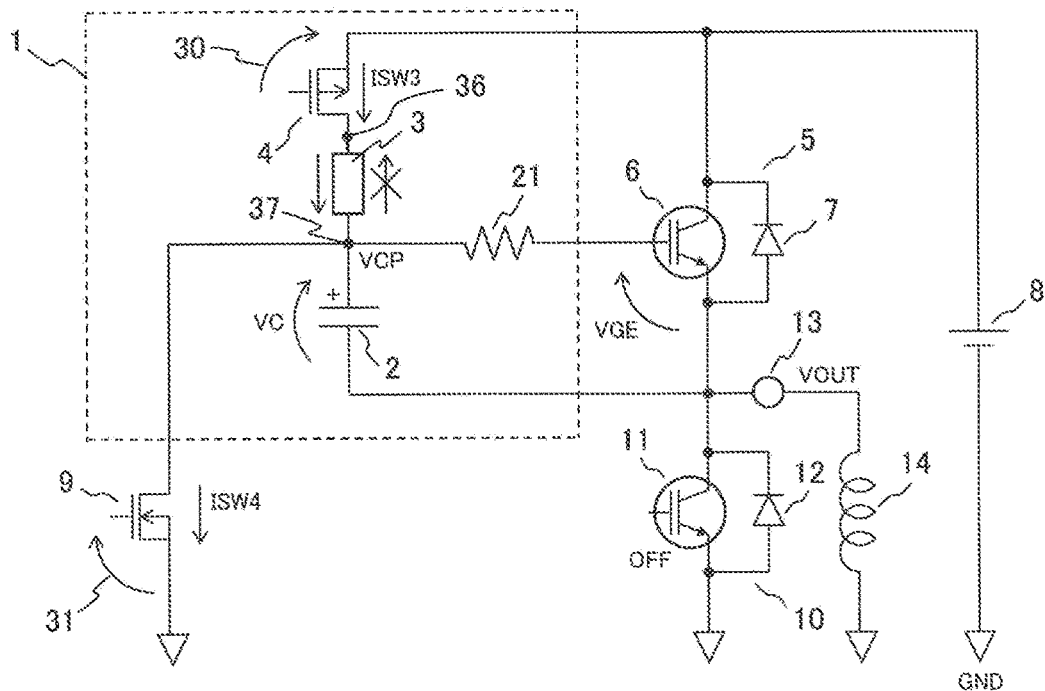
FIG. 9 is a diagram showing a concrete example of the upper arm drive circuit shown in FIG. 7 (a fifth concrete example)
Figure 10:
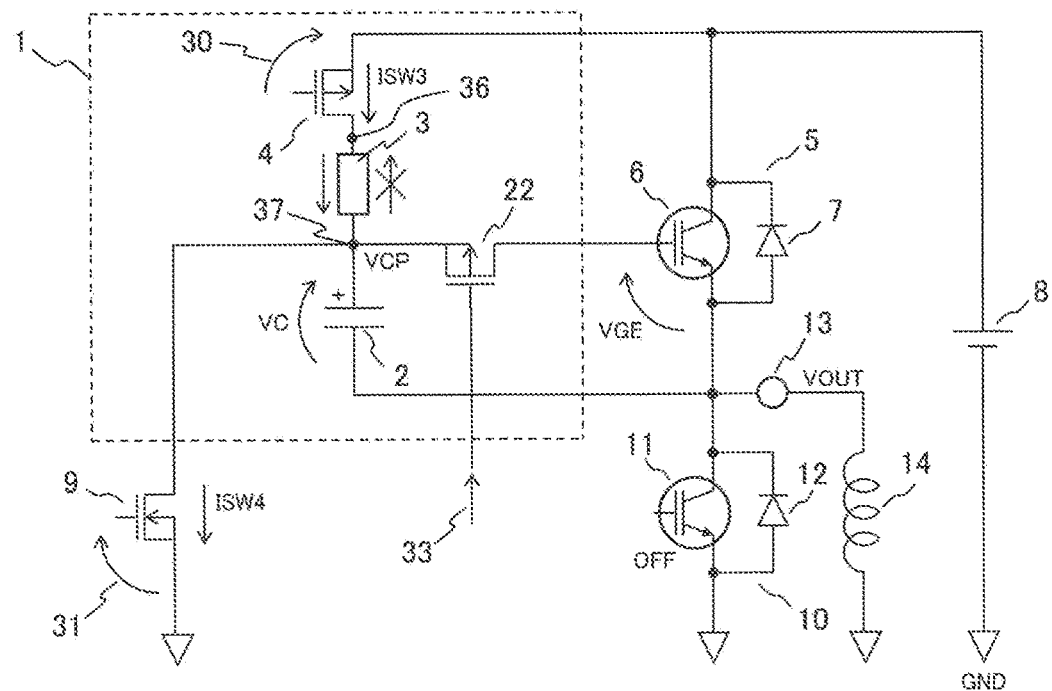
FIG. 10 is a diagram showing a concrete example of the upper arm drive circuit shown in FIG. 7 (a sixth concrete example)
Figure 11:
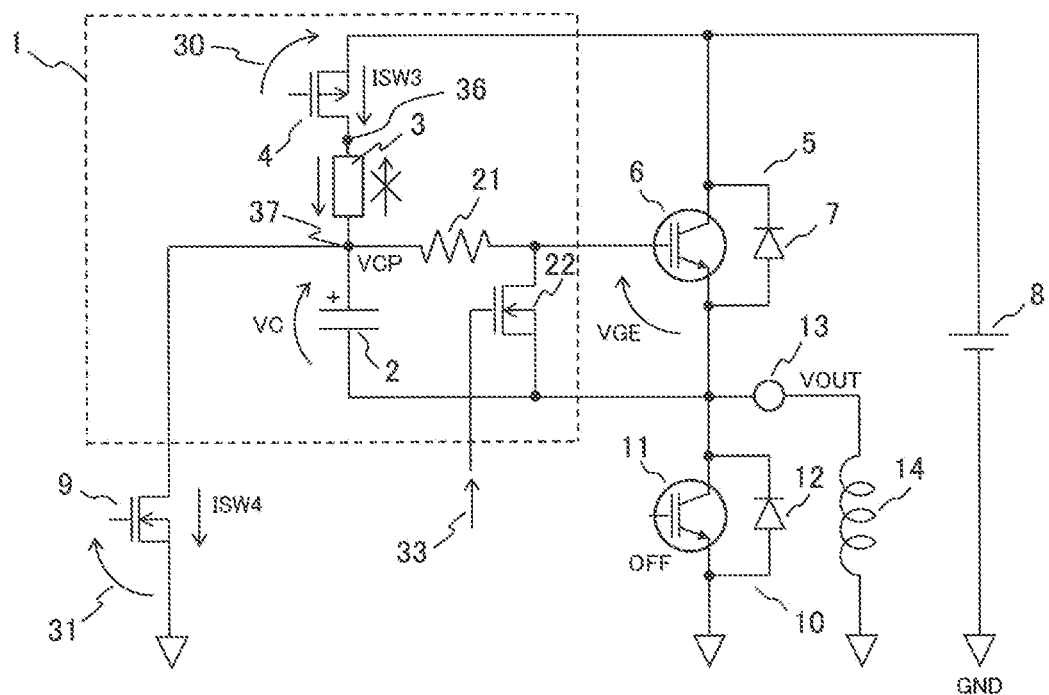
FIG. 11 is a diagram showing a concrete example of the upper arm drive circuit shown in FIG. 7 (a seventh concrete example)

The configuration of an upper arm drive circuit of a second embodiment of the present invention and the behavior (control method) of the upper arm drive circuit will be explained with reference to FIG. 7 to FIG. 11. FIG. 7 is a diagram showing the outline configuration of the upper arm drive circuit of this embodiment, and FIG. 8 is a timing chart showing the behavior of the upper arm drive circuit. FIG. 9 to FIG. 11 show three concrete examples for realizing the upper arm drive circuit shown in FIG. 7.

As shown in FIG. 7, the configuration of the upper arm drive circuit 1 of this embodiment is equal to the configuration of the first embodiment (FIG. 1) plus a delay circuit 20 disposed between a capacitor 2 and a switching element 6 that is an upper arm switching element. The configuration of the upper arm drive circuit 1 of this embodiment other than the delay circuit 20 is the same as the configuration of the first embodiment. Here, in the second embodiment, since no parasitic capacitor of the switching element 6 can be found around a position where the capacitor 2 should be located, a discrete element is used as the capacitor 2.

The behavior of the upper arm drive circuit 1 shown in FIG. 7 will be explained with reference to FIG. 8. First, a main power supply 8 is turned ON. Next, a command signal (an upper arm ON signal 30) for turning a switching element 6 ON is inputted into the switching element 4, so that the capacitor 2 is charged by a current flowing through the switching element 4 and a reverse current prevention circuit 3.

In this case, voltage transmission from the charging voltage VC of the capacitor 2 to the gate voltage VGE of the switching element 6 is delayed by the delay circuit 20. Charging of the capacitor 2 is performed during a time from turning-ON of the switching element 4 to turning-ON of the switching element 6, so that the charge amount of the capacitor 2 in the presence of a delay DT is larger in comparison with the charge amount of the capacitor 2 in the absence of the delay DT, that is, in the first embodiment (FIG. 1).

If the gate voltage VGE of the switching element 6 becomes equal to the threshold voltage VTH_SW1 of the switching element 6 or larger, the switching element 6 that is the upper arm switching element is turned ON.

In this case, the charge of the capacitor 2 is prevented from being discharged through the switching element 4 to the main power supply 8 side by the reverse current prevention circuit 3, so that the charging voltage VC of the capacitor 2 is kept intact. In addition, the voltage transmission from the charging voltage VC of the capacitor 2 to the gate voltage VGE of the switching element 6 is delayed by the delay circuit 20, and the gate voltage VGE of the switching element 6 becomes the same voltage as the charging voltage VC of the capacitor 2 after a certain delay. Because the gate voltage VGE of the switching element 6 is kept intact, the ON-state of the switching element 6 that is the upper arm switching element is also kept as it is.

During the time of the switching element 6 being in an ON-state, the power supply voltage VS of the main power supply 8 is outputted from the output terminal 13 of the power conversion device as an output terminal voltage VOUT. During this time, the positive pole side voltage VCP of the capacitor 2 (relative to the ground potential GND) becomes equal to the sum of the power supply voltage VS and the threshold voltage VTH_SW1 of the switching element 6 or larger.

Afterward, a command signal (an upper arm OFF signal 31) for turning the switching element 6 OFF is inputted into a switching element 9 that is a switching element for discharging the capacitor 2, and the switching element 9 is turned ON, so that the capacitor 2 is discharged. Therefore, the gate voltage VGE of the switching element 6 decreases to the threshold voltage VTH_SW1 or smaller, and the switching element 6 that is the upper arm switching element is turned OFF.

According to the above-described upper arm drive circuit of this embodiment and the behavior (control method) of the upper arm drive circuit, since the voltage transmission from the charging voltage VC of the capacitor 2 to the gate voltage VGE of the switching element 6 is delayed by the delay circuit 20, the charge amount of the capacitor 2 in the presence of the delay is larger in comparison with the charge amount of the capacitor 2 in the absence of the delay (in the first embodiment; FIG. 1), so that it becomes possible to apply a higher gate voltage to the switching element 6 that is the upper arm switching element.

As described above, because the gate voltage of the switching element 6 that is the upper arm switching element can be kept high, the ON-voltage of the switching element 6 is reduced, so that the occurrence of loss at the switching element 6 can be reduced.

Using FIG. 9 to FIG. 11, three concrete examples for realizing the upper arm drive circuit shown in FIG. 7 will be explained.

FIG. 9 shows that a resistor 21 is used as the delay circuit 20. Using a resistive element as the delay circuit 20 makes it possible to realize the upper arm drive circuit 1 in a simple configuration and at low cost as well.

FIG. 10 shows that a MOS transistor is used as the delay circuit 20, where the MOS transistor functions as a switching element 22 that is a switching element for a delay circuit. Since the MOS transistor is used for the delay circuit 20, the ON/OFF control of the delay circuit 20 is performed by a delay signal issued from outside. Because the delay circuit 20 can be controlled from the delay signal issued from outside, the control accuracy and controllability (freedom degree of control) of the upper arm drive circuit are improved.

FIG. 11 shows that the upper arm drive circuit includes a resistor and a MOS transistor that is the switching element 22 for a delay circuit as the delay circuit 20. A resistor 21 is disposed between the capacitor 2 and the gate of the switching element 6 that is the upper arm switching element, and further a MOS transistor is disposed between the gate of the switching element 6 and the output terminal 13 of the power conversion device so that the ON/OFF operation of the delay circuit 20 is performed by the delay signal 33 issued from outside. By composing the delay circuit with the resistor 21 and the MOS transistor that can be controlled by the delay signal 33 issued from outside, it becomes possible to utilize the advantageous effect of a delay circuit more certainly and improve the control accuracy and controllability (freedom degree of control) of the upper arm drive circuit as well.

Third Embodiment

Figure 12:
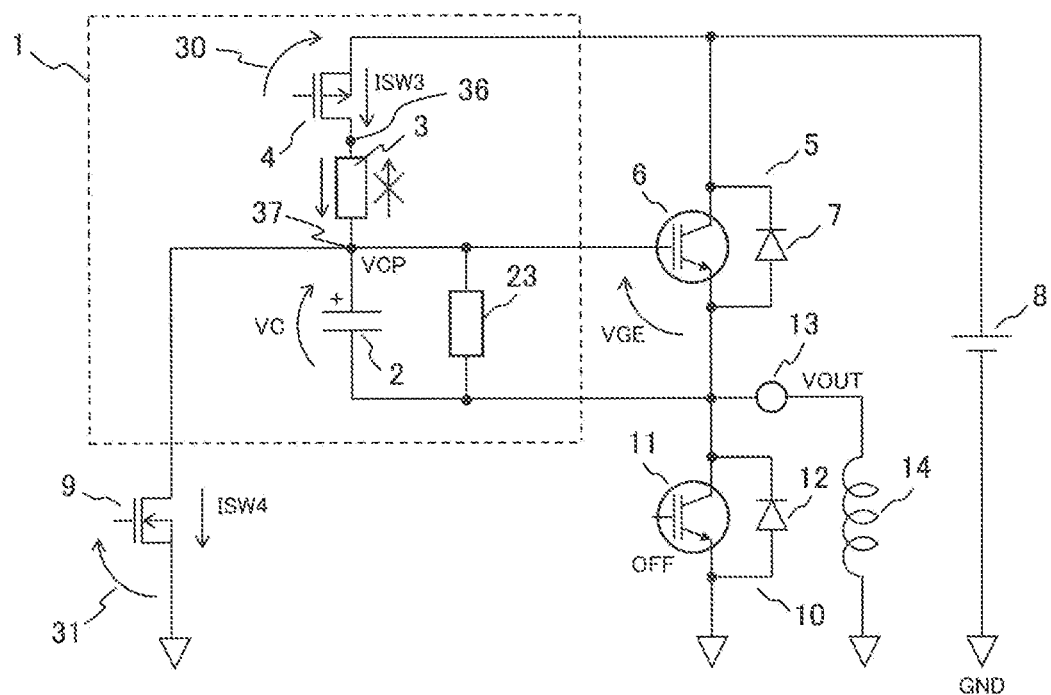
FIG. 12 is a diagram showing the outline configuration of an upper arm drive circuit according to a third embodiment of the present invention.
Figure 13:
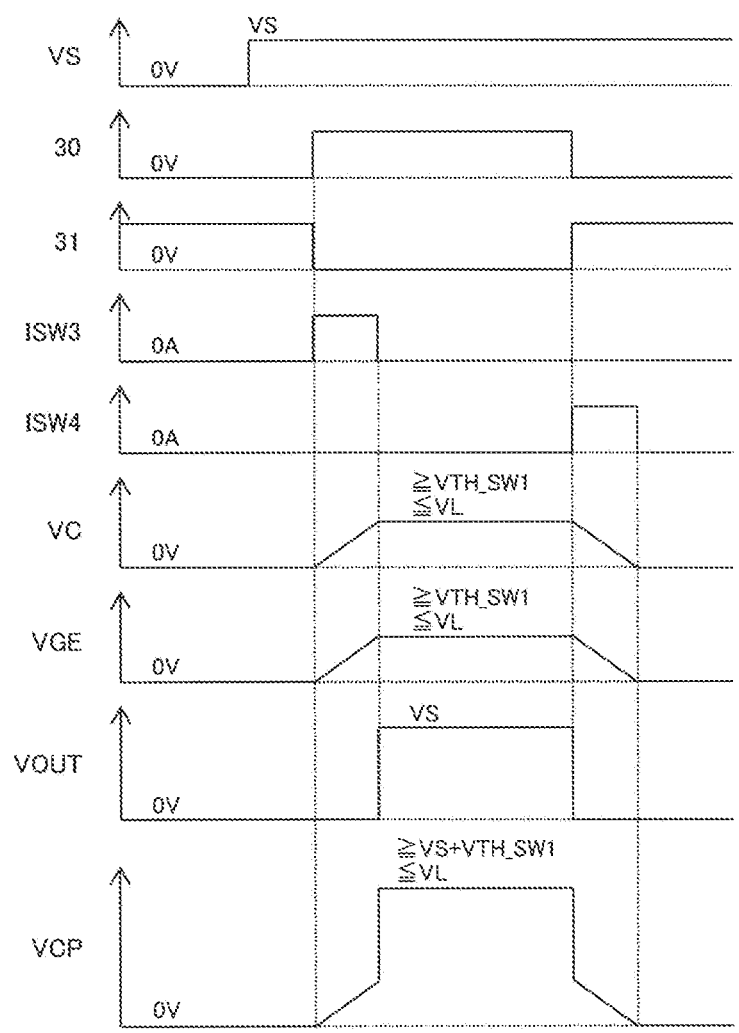
FIG. 13 is a timing chart showing the behavior of the upper arm drive circuit according to the third embodiment of the present invention.
Figure 14:
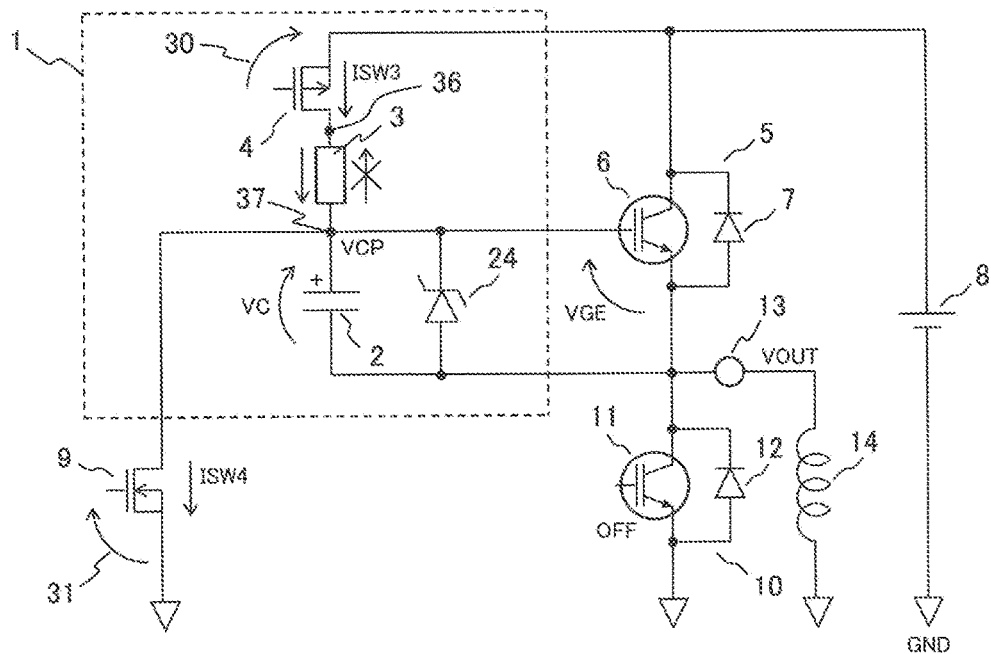
FIG. 14 is a diagram showing a concrete example of the upper arm drive circuit shown in FIG. 12 (an eighth concrete example)

The configuration of an upper arm drive circuit of a third embodiment of the present invention and the behavior (control method) of the upper arm drive circuit will be explained with reference to FIG. 12 to FIG. 14. FIG. 12 is a diagram showing the outline configuration of the upper arm drive circuit of this embodiment, and FIG. 13 is a timing chart showing the behavior of the upper arm drive circuit. FIG. 14 shows one concrete example for realizing the upper arm drive circuit shown in FIG. 12.

As shown in FIG. 12, the configuration of the upper arm drive circuit 1 of this embodiment is equal to the configuration of the first embodiment (FIG. 1) plus a voltage limitation circuit 23 that is disposed between the gate of a switching element 6 that is an upper arm switching element and the output terminal 13 of a power conversion device in parallel with a capacitor 2. The configuration of the upper arm drive circuit 1 of this embodiment other than the voltage limitation circuit 23 is the same as the configuration of the first embodiment. As is the case with the first embodiment, either a discrete element or a parasitic capacitor of the switching element 6 can be used as the capacitor 2.

The behavior of the upper arm drive circuit 1 shown in FIG. 12 will be explained with reference to FIG. 13. First, a main power supply 8 is turned ON. Next, a command signal (an upper arm ON signal 30) for turning a switching element 6 ON is inputted into the switching element 4, so that the capacitor 2 is charged by a current flowing through the switching element 4 and a reverse current prevention circuit 3.

If the gate voltage VGE of the switching element 6 (that is, the charging voltage VC of the capacitor 2) becomes equal to the threshold voltage VTH_SW1 of the switching element 6 or larger, the switching element 6 that is the upper arm switching element is turned ON.

In this case, the gate voltage VGE of the switching element 6 becomes equal to a predetermined voltage (the limitation voltage of the voltage limitation circuit: VL) or smaller owing to the function of the voltage limitation circuit 23. The charge of the capacitor 2 is prevented from being discharged from the capacitor 2 to the main power supply 8 side via the switching element 4 by the reverse current prevention circuit 3, so that the charging voltage VC of the capacitor 2 is kept intact. As a result, since the gate voltage VGE of the switching element 6 is kept intact, the ON-state of the switching element 6 that is the upper arm switching element is also kept as it is.

During the time of the switching element 6 being in an ON-state, the power supply voltage VS of the main power supply 8 is outputted from the output terminal 13 of the power conversion device as an output terminal voltage VOUT. During this time, the positive pole side voltage VCP of the capacitor 2 (relative to the ground potential GND) becomes equal to the sum of the power supply voltage VS and the threshold voltage VTH_SW1 of the switching element 6 or larger, and equal to the limitation voltage VL of the voltage limitation circuit 23 or smaller.

Afterward, a command signal (an upper arm OFF signal 31) for turning the switching element 6 OFF is inputted into a switching element 9 that is a switching element for discharging the capacitor 2, and the switching element 9 is turned ON, so that the capacitor 2 is discharged. Therefore, the gate voltage VGE of the switching element 6 decreases to the threshold voltage VTH_SW1 or smaller, and the switching element 6 that is the upper arm switching element is turned OFF.

According to the above-described upper arm drive circuit of this embodiment and the behavior (control method) of the upper arm drive circuit, since an excessively high voltage from the charging voltage VC of the capacitor 2 is prevented from being applied to the gate voltage VGE of the switching element 6 by the voltage limitation circuit 23, the breakdown of the switching element 6 that is the upper arm switching element can be prevented.

FIG. 14 shows one concrete example for realizing the upper arm drive circuit shown in FIG. 12. FIG. 14 shows that a Zener diode 24 is used as the voltage limitation circuit 23. Using the Zener diode as the voltage limitation circuit 23 makes it possible to realize the upper arm drive circuit 1 in a simple configuration and at low cost as well.

Here, it is conceivable that each of the above-described embodiments is configured as a one-chip inverter IC in such a way that the capacitor 2, the reverse current prevention circuit 3, and the switching element 4 that is the switching element for capacitor charging are formed on the same semiconductor chip on which the switching element 6 that is the upper arm switching element is formed. Furthermore, some or all of the delay circuit 20, the voltage limitation circuit 23, the switching element 9 that is the switching element for capacitor discharging, and other elements having power conversion functions, and the like can be formed on the same semiconductor chip.

Alternatively, it is conceivable that each of the above-described embodiments is configured as a multi-chip type inverter control IC in such a way that the capacitor 2, the reverse current prevention circuit 3, and the switching element 4 that is the switching element for capacitor charging are formed on a semiconductor chip different from a semiconductor chip on which the switching element 6 that is the upper arm switching element is formed. Furthermore, some or all of the delay circuit 20, the voltage limitation circuit 23, the switching element 9 that is the switching element for capacitor discharging, and the like can be formed on the same semiconductor chip on which the capacitor 2, the reverse current prevention circuit 3, and the switching element 4 are formed.

In addition, if there is a minute leakage current flowing backward through the reverse current prevention circuit 3 in each of the above-described embodiments, it becomes difficult to permanently hold the charge of the capacitor 2. In such a case, by imposing a duty limit on the command signal (the upper arm ON signal) for turning the switching element 6 ON so that the switching element 6 is turned OFF before the gate voltage VGE of the switching element 6 decreases to the threshold voltage VTH_SW1 owing to the discharge of the capacitor 2 caused by the leakage current, and by turning the switching element 6 ON again, it becomes possible to remove the influence of the leakage current of the reverse current prevention circuit 3.

Furthermore, the present invention is not limited to the above-described embodiments, and the present invention may include various kinds of modifications. For example, the above embodiments have been described in detail in order to explain the present invention in an easy-to-understand manner, and embodiments according to the present invention are not necessarily limited to embodiments which include all configurations that have been described so far. In addition, a part of the configuration of one embodiment can be replaced with a part of the configuration of another embodiment, and furthermore, it is also possible to add the configuration of one embodiment to the configuration of another embodiment. In addition, a new embodiment according to the present invention may be made by deleting a part of the configuration of each embodiment, by adding another configuration to a part of the configuration of each embodiment, or by replacing a part of configuration of each embodiment with another embodiment.

REFERENCE SIGNS LIST

1 . . . upper arm drive circuit
2 . . . capacitor (first capacitor)
3 . . . reverse current prevention circuit
4 . . . switching element (switching element for capacitor charging)
5 . . . upper arm
6 . . . switching element (upper arm switching element)
7 . . . free-wheeling diode
8 . . . main power supply
9 . . . switching element (switching element for discharging capacitor)
10 . . . lower arm
11 . . . switching element (lower arm switching element)
12 . . . free-wheeling diode
13 . . . output terminal
14 . . . load (coil)
15 . . . diode
16 . . . switching element (reverse current prevention switching element)
17 . . . switching element (reverse current prevention switching element)
18 . . . resistor
19 . . . capacitor (second capacitor)
20 . . . delay circuit
21 . . . resistor
22 . . . switching element (switching element for delay circuit)
23 . . . voltage limitation circuit
24 . . . Zener diode
25 . . . control circuit power supply
26 . . . diode
27 . . . capacitor
28 . . . latch circuit
29 . . . buffer
30 . . . upper arm ON signal
31 . . . upper arm OFF signal
33 . . . delay signal
34 . . . upper arm ON pulse signal
35 . . . upper arm OFF pulse signal
36 . . . first terminal
37 . . . second terminal
VCC . . . control circuit power supply voltage
VS . . . power supply voltage
VC . . . charging voltage of capacitor
VCB . . . capacitor charging voltage
VCP . . . positive pole side voltage of capacitor 2 (relative to ground potential GND)
VGE . . . gate voltage VGE (of switching element 6)
VOUT . . . output terminal voltage
VB . . . positive pole side voltage VB of capacitor 27 (relative to ground potential GND)
VTH_SW1 . . . threshold voltage VTH_SW1 of switching element 6
VL . . . limitation voltage of voltage limitation circuit
ISW3 . . . flowing current (of switching element 4)
ISW4 . . . flowing current (of switching element 9)

What is claimed is:

1. An upper arm drive circuit for controlling drive of an upper arm switching element of a power conversion device, the upper arm drive circuit comprising:
a first capacitor disposed between a gate of the upper arm switching element and an output terminal of the power conversion device;
a reverse current prevention circuit disposed between a power supply of the power conversion device and the first capacitor, the reverse current prevention circuit making a current flow from a first terminal side of the reverse current prevention circuit connected to a power supply side to a second terminal side of the reverse current prevention circuit connected to a first capacitor side and preventing a reverse current from flowing from the second terminal side to the first terminal side;
a switching element for capacitor charging that is connected to the first terminal side or to the second terminal side of the reverse current prevention circuit so as to be serially connected to the reverse current prevention circuit between the power supply and the first capacitor and that is turned ON in synchronization with a command signal that turns the upper arm switching element ON;
a delay circuit disposed between the first capacitor and the gate of the upper arm switching element;
a voltage limitation circuit that is disposed between the gate of the upper arm switching element and the output terminal of the power conversion device in parallel with the first capacitor; and
a discharging circuit for discharging charge of the first capacitor in synchronization with a command signal that turns the upper arm switching element OFF.

2. The upper arm drive circuit according to claim 1, wherein the reverse current prevention circuit is a diode or a plurality of diodes that are serially connected.

3. The upper arm drive circuit according to claim 1, wherein the reverse current prevention circuit includes a first MOS transistor, and
a drain of the first MOS transistor is connected to the first terminal side, a source of the first MOS transistor is connected to the second terminal side, a gate of the first MOS transistor and the drain of the first MOS transistor are connected to each other, and a back-gate of the first MOS transistor is connected to the output terminal of the power conversion device.

4. The upper arm drive circuit according to claim 3, wherein the reverse current prevention circuit includes a second MOS transistor and a resistor,
wherein a drain of the second MOS transistor is connected to the first terminal side, a source of the second MOS transistor is connected to the output terminal of the power conversion device via the resistor, and a gate of the second MOS transistor is connected to the first capacitor and the gate of the upper arm switching element, and
wherein the back-gate of the first MOS transistor and a back-gate of the second MOS transistor are connected to the output terminal of the power conversion device via the resistor.

5. The upper arm drive circuit according to claim 3,
wherein the reverse current prevention circuit includes a resistor and a second capacitor different from the first capacitor,
wherein the back-gate of the first MOS transistor is connected to the output terminal of the power conversion device via the resistor, and
wherein the second capacitor is disposed between the back-gate of the first MOS transistor and the first capacitor.

6. The upper arm drive circuit according to claim 1, wherein the delay circuit is a resistive element.

7. The upper arm drive circuit according to claim 1, wherein the delay circuit is a MOS transistor and ON/OFF operation of which is controlled by a delay signal issued from outside.

8. The upper arm drive circuit according to claim 1, wherein the delay circuit includes:
a resistive element disposed between the first capacitor and the gate of the upper arm switching element; and
a MOS transistor that is disposed between the gate of the upper arm switching element and the output terminal of the power conversion device and ON/OFF operation of which is controlled by a delay signal issued from outside.

9. The upper arm drive circuit according to claim 1, wherein the voltage limitation circuit is a Zener diode.

10. The upper arm drive circuit according to claim 1, wherein the first capacitor, the reverse current prevention circuit, and the switching element for capacitor charging are formed on a same semiconductor chip on which the upper arm switching element is formed.

11. The upper arm drive circuit according to claim 1, wherein the first capacitor, the reverse current prevention circuit, and the switching element for capacitor charging are formed on a semiconductor chip different from a semiconductor chip on which the upper arm switching element is formed.

* * * * *